US006048574A

United States Patent [19]

Atarashi et al.

[11] Patent Number: 6,048,574

[45] Date of Patent: Apr. 11, 2000

[54] POWDER HAVING AT LEAST ONE LAYER AND PROCESS FOR PREPARING THE SAME

[75] Inventors: Takafumi Atarashi, Tokyo; Hiroki Okudera, Ishikawa, both of Japan

[73] Assignee: Nittetsu Mining Co., Ltd., Tokyo, Japan

[21] Appl. No.: 08/976,715

[22] Filed: Nov. 24, 1997

Related U.S. Application Data

[62] Division of application No. 08/532,994, Sep. 25, 1995, Pat. No. 5,763,085, which is a division of application No. 08/192,044, Feb. 4, 1994, abandoned.

[30] Foreign Application Priority Data

| | | | |
|---|---|---|---|
| Feb. 5, 1993 | [JP] | Japan | 5-040678 |
| Sep. 16, 1993 | [JP] | Japan | 5-252170 |

[51] Int. Cl.[7] .............................. B05D 5/12; C23C 16/00

[52] U.S. Cl. .......................... 427/127; 423/592; 423/593; 427/131; 427/212; 427/214; 427/215; 427/226; 427/248.1

[58] Field of Search .................................... 427/212, 226, 427/126.6, 169, 243, 248.1, 214, 215, 128, 131, 127; 423/592, 593

[56] References Cited

U.S. PATENT DOCUMENTS

| | | | |
|---|---|---|---|
| 4,724,134 | 2/1988 | Sood | 423/592 |
| 5,023,071 | 6/1991 | Sherif | 423/592 |
| 5,112,676 | 5/1992 | Cot et al. | 427/226 |
| 5,137,749 | 8/1992 | Yamazaki et al. | 427/108 |
| 5,145,719 | 9/1992 | Towata et al. | 427/215 |
| 5,415,748 | 5/1995 | Emiliani et al. | 204/181.5 |
| 5,474,583 | 12/1995 | Celikkaya | 51/309 |
| 5,573,582 | 11/1996 | Inui et al. | 106/287.17 |
| 5,763,085 | 6/1998 | Atarashi et al. | 428/403 |

*Primary Examiner*—Hoa T. Le
*Attorney, Agent, or Firm*—Sughrue, Mion, Zinn, Macpeak & Seas, PLLC

[57] ABSTRACT

A powder comprising a metal or metallic compound core having thereon at least one metal or metallic oxide layer having a uniform thickness of from 0.01 μm to 20 μm, wherein the metal of the metal or metallic oxide layer is different from the metal constituting the metal or metallic compound core and a process for preparing the same.

5 Claims, 1 Drawing Sheet

POWDER HAVING AT LEAST ONE LAYER AND PROCESS FOR PREPARING THE SAME

This is a divisional of application Ser. No. 08/532,994 filed Sep. 25, 1995 now U.S. Pat. No. 5,763,085, and Ser. No. 08/192,044 filed Feb. 4, 1994 now abandoned.

FIELD OF THE INVENTION

This invention relates to a metal or metallic compound powder having on the surface thereof at least one thick metal or metallic oxide layer. More particularly, it relates to a novel metal or metallic compound powder composed of metal or metallic compound powder and a thick surface layer comprising an oxide of a different metal, in order to provide complex properties and to exhibit complex functions. More specifically, it relates to a magnetic powder or magnetic particle having multiple layers on the surface thereof which is useful as a starting material for color magnetic materials, such as color magnetic toners and color magnetic inks.

BACKGROUND OF THE INVENTION

It is well known that metallic materials or products, even with a polished finish, are covered with a thin oxide layer formed by oxidation in air. Known film formation techniques for protecting the surface of a product or for forming a thin film include coating, depositing, anodizing, sputtering, vacuum evaporation, electrodeposition, and so forth. Coating is suitable for obtaining a thick film, but the coating film is non-uniform in thickness and has poor adhesion. While anodizing, sputtering or vacuum evaporation provides a film having a fairly uniform composition with good adhesion, there is obtained only a thin film. Where anodizing is applied to an aluminum substrate, the resulting aluminum oxide layer is not dense. Electrodeposition and anodizing are not suitable for the treatment of powder because an object to be treated must serve as an electrode.

These conventional techniques can easily be carried out in cases where a substrate has a large size. However, they are not applicable to a powdered product without some additional techniques. Even when using additional techniques, it has been difficult to form a film of uniform thickness on the powder surface.

With reference to metal powder, formation of an oxide layer on the surface thereof is not difficult because the surface metal undergoes oxidation on exposure to an oxidizing atmosphere, thereby to form a thin oxide layer spontaneously. However, where the metal is very susceptible to oxidation or where the particle size is small, the spontaneous oxidation process cannot be adopted because the reaction proceeds too rapidly, leading to ignition. If the degree of oxidation is controlled, the resulting oxide layer would be too thin for practical use. While the surface of metal powder may be oxidized with an oxidizing agent in a liquid system, the contact with an oxidizing agent cannot be effected uniformly because of the heterogeneous system so that formation of a metallic oxide layer of uniform thickness has been difficult. If the reaction is controlled so as to form a dense oxide layer, it is difficult to form a thick film. Hence, it has not been easy to form a dense film to a desired film thickness.

It is more difficult to uniformly form an oxide layer of a metal different from the substrate metal powder. Although there is a technique of coating silicon oxide or titanium oxide on metal powder to a very small thickness for the purpose of surface treatment, the technique is accompanied with difficulty in providing a uniform and large thickness. Where depositing and coating techniques, though capable of forming a thick film on a metallic substrate, are applied to metal powder, the metal powder must be kept in a dispersed state. As a result, particles formed solely of the coating substance are likely to be formed, in addition to the desired coated metal powder, only to provide a mixture of the powder of the coating substance and the coated metal powder. No technique is available for coating metal powder with an oxide of a different metal to a large thickness without producing particles solely comprising the metallic oxide.

Various difficulties are also met with in coating a powder of a metallic compound with an oxide of a metal different from that constituting the metallic compound. For example, in the case where a metallic compound is deposited on a powder in a metallic salt aqueous solution, and the deposit is heated to be converted to the corresponding oxide, the aqueous solution is impregnated into the substrate metallic compound. The results is that the deposited metallic compound, such as a metallic oxide, contains a different metallic oxide and that a dense oxide layer cannot be obtained.

It has been proposed to form a silver film on mica, which is a non-metallic object, by calcination and reduction for the purpose of imparting a metallic luster to mica as disclosed in JP-A-1-208324 (the term "JP-A" as used herein means an "unexamined published Japanese patent application). This process, however, involves a heat treatment in a high temperature and therefore cannot be applied to general powdered objects.

Further, *KINZOKU HYOMEN GIJUTSU* (*METAL SURFACE TECHNOLOGY*), Vol. 17, No. 8, p. 299 et seq. (1966) reports an electroless plating process for forming a metallic cobalt film on a plate, which comprises immersing a plate object in a cobalt complex salt aqueous solution and reducing the cobalt complex ion. However, these disclosures make no mention of formation of a plurality of layers.

With respect to formation of a metal coating layer on the surface of metal powder or metallic oxide powder, JP-A-3-271376 proposes a process for forming a metallic cobalt coating layer on the surface of a powdered metal, e.g., cobalt, nickel or iron, or a powdered metallic oxide, e.g., ferrite or chromium oxide, by reducing a water-soluble cobalt salt in a wet system. Similarly, JP-A-3-274278 discloses a process for forming a metallic silver coating layer on the surface of a powdered metal, e.g., cobalt, nickel or iron, or a powdered metallic oxide, e.g., ferrite or chromium oxide, by reducing a water-soluble silver salt in a wet system.

JP-A-60-184570 discloses a process for changing a color tone by forming a metallic oxide layer on a metallic oxide powder (mica). In this process, a titanium oxide is prepared by calcination after a titanium hydrate is formed on a surface of the powder in a solution of sulfate. This process, however, is not preferable because all metallic fine particles are dissolved when the particles are put into the solution according to this process.

With the recent advancement in various technological fields, there has been an increasing demand for metal or metallic compound powder having a specific function in addition to the properties essentially possessed by the powder.

For example, conventional magnetic powders, whose color is acceptable for use in conventional black magnetic toners, cannot be used as a material for color magnetic toners. Metal powder having high heat conductivity cannot be used as such as a heat dissipating filler of a sealing compound for semiconductors, because it is required to have electrical insulating properties; metal powder for this use should have a surface layer with sufficient electrical insulating properties. Conventional methods for forming a thin oxide layer on the surface of a powder, which have been regarded as adequate for such purposes as protection of powder and facilitation of mixing of powder with a synthetic resin, etc., no longer meet these new demands. To satisfy these requirements, a powder having a novel structure is urgently required.

For the purpose of developing highly functional metal or metallic compound powders exhibiting specific properties in addition to the properties essentially possessed by the powder, the present inventors have made an effort to provide a metal or metallic oxide layer on the surface of metal or metallic compound powder as a core substrate.

However, it has been difficult to obtain a functional powder of good quality by forming a single coat on a powder substrate. For example, in preparation of white magnetic powder which can be used as a starting material for color magnetic materials, such as a color magnetic toner and a color magnetic ink, a coating layer comprising metallic cobalt or metallic silver may be formed on a powdered magnetic substance, such as metallic iron, ferrite or chromium oxide, according to the disclosure of JP-A-3-271376 or JP-A-3-274278. In this case, however, the coating layer should have a considerably large thickness, and even with a large thickness the resulting coated powder still has insufficient whiteness.

SUMMARY OF THE INVENTION

An object of the present invention is to provide a metal or metallic compound powder having complex properties, suitable for performing complex functions to satisfy the new demands.

Another object of the present invention is to provide a metal or metallic compound powder with a metal or metallic oxide surface layer, and particularly a magnetic powder suitable as a material for preparing a color magnetic toner suited for use in an electrophotographic copying machine.

Still another object of the present invention is to provide a heat conductive powder having electrical insulating properties.

A further object of the present invention is to provide a process for preparing such a metal or metallic compound powder having complex properties and performing complex functions.

The present inventors have conducted extensive study on various means for preparing powder satisfying the above-mentioned requirements. As a result, it has now been found that a thick and uniform metal or metallic oxide layer can be formed on a metal or metallic compound powder by dispersing the metal or metallic compound powder in a metal alkoxide solution and hydrolyzing the metal alkoxide.

DETAILED DESCRIPTION OF THE INVENTION

Figure 1:
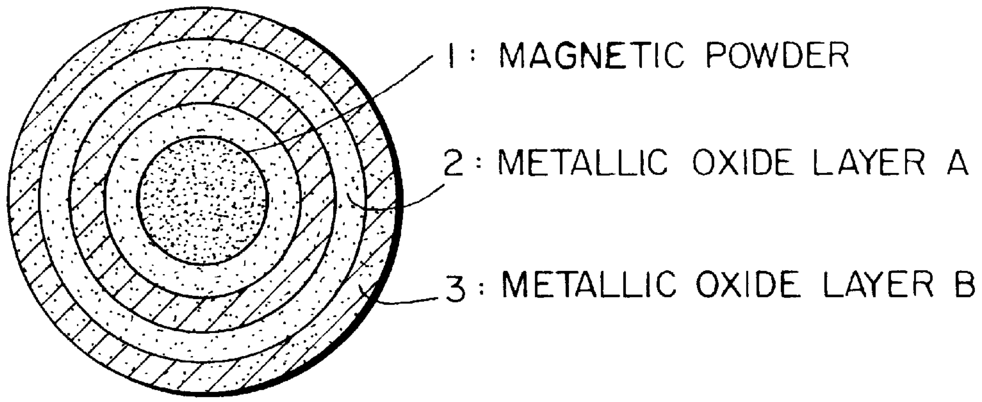
FIGS. 1 and 2 each illustrates a cross section of a magnetic powder for color magnetic toners according to the present invention.

More specifically, these and other objects of present invention are accomplished by (a) powder comprising a metal or metallic compound core having thereon a metal or metallic oxide layer having a uniform thickness of from 0.01 μm to 20 μm, wherein the metal of the metal or metallic oxide layer is different from the metal constituting the metal or metallic compound core; (b) powder comprising a metal or metallic compound core having thereon at least two metal or metallic oxide layers each having a uniform thickness of from 0.01 μm to 20 μm, wherein the metal or metallic oxide layer which is in contact with the metal or metallic compound core is different from the metal constituting the metal or metallic compound core; (c) a process for preparing powder comprising a metal or metallic compound core having thereon a metallic oxide layer by dispersing a metal or metallic compound powder in a solution of a metal alkoxide and hydrolyzing the metal alkoxide to form a metallic oxide layer on the surface of the metal or metallic compound powder; or (d) a process for preparing powder comprising a metal or metallic compound core having thereon a metallic oxide layer and a metal layer by dispersing a metal or metallic compound powder, which may have a metal surface layer, in a solution of a metal alkoxide, hydrolyzing the metal alkoxide to form a metallic oxide layer on the surface of the metal or metallic compound powder, and forming a metal layer on the surface of the metallic oxide layer.

In particular, excellent white magnetic powder or particle for use in production of color magnetic materials, such as color magnetic toners and color magnetic inks, can be obtained by forming a plurality of layers comprising at least one metal layer and at least one metallic oxide layer each having a uniform thickness of from 0.01 μm to 20 μm on the surface of a magnetic core metal or metallic compound.

For example, a metal layer is first formed on powder of a magnetic substance, e.g., metallic iron, ferrite or chromium oxide, a metallic oxide layer is then formed on the metal layer, and finally a coating layer of metallic cobalt or metallic silver is provided thereon.

Other types of powder having complex functions can also be obtained by formation of a metal layer and a metallic oxide layer on a powder substrate. For example, formation of a plurality of metal layers and metallic oxide layers on a metal powder substrate having satisfactory heat conductivity, such as metallic silver or metallic copper, provides powder having thereon an insulating layer with good adhesion, thereby exhibiting not only heat conductivity but insulating properties.

Further, in particular, an excellent white magnetic powder for use in production of color magnetic materials can be prepared by a process comprising dispersing a powder of a magnetic metal or metallic compound previously having thereon a metal layer in a solution of a metal alkoxide, hydrolyzing the metal alkoxide to form a metallic oxide layer on the surface of the metal layer of the metal or metallic compound, and forming a metal layer on the surface of the metallic oxide layer.

According to this process, by using a metal powder having a high reflectance as a substrate, excellent white magnetic powder may be prepared even if the first step of forming the innermost metal layer is omitted, when the kind of the metallic oxide layer, the kind of the outermost metal layer, and the thickness of each layer are appropriately selected.

The term "at least two metal or metallic oxide layers" as used herein means (i) at least two metal layers, (ii) at least two metallic oxide layers, or (iii) at least one metal layer and at least one metallic oxide layer.

The term "metal" as used for metal and metallic compound (including metal powder and metallic compound powder) as used herein includes not only a metal, but also an alloy thereof. More specifically, the term "iron" includes iron alloys, e.g., iron-nickel and iron-cobalt; the term "iron nitride" includes an iron-nickel nitride and an iron-nickel-cobalt nitride; and the term "iron oxide" includes an iron-nickel oxide and an iron-nickel-cobalt oxide. Further, the term "metal alkoxide" includes mixed metal alkoxides. For example, a barium alkoxide may contain a calcium alkoxide. These examples are not to be construed as limiting the present invention, which includes other iron alloys, iron nitrides, iron oxides and metal alkoxides.

Formation of a metal layer on the surface of a powder substrate can be preferably carried out by electroless plating. It may be done by contact electroplating or sputtering as described in E. Takeshima, *FUNTAI KOGAKU KAISHI*, "The Approach to Creation of New Composite Materials", vol. 27 No. 7, pp 480–484 (1990). However, in contact electroplating, plating would not be effected without contact of the powder with an electrode, and in sputtering, metal vapor is not uniformly applied to the powder. As a result, the thickness of the metal layer formed varies among individual particles. To the contrary, electroless plating provides a dense and uniform metal layer with easy control of thickness. The present invention will be explained chiefly referring to film formation by electroless plating, but the film formation technique employable in the present invention is not to be construed as being limited thereto.

The powdered metal, a substrate on which a metal or metallic oxide layer is to be formed, is not limited and includes iron, nickel, chromium, titanium and aluminum. The metal may be a magnetic metal. Magnetic metal powder, such as iron powder, is preferred for making use of its magnetic properties. As described above, the metal may be an alloy. Ferromagnetic alloys are preferred as magnetic powder.

In using metal powder as a substrate, the process of the present invention typically includes first forming a metallic oxide layer on the substrate and then forming a metal layer thereon. If desired, a metallic oxide layer is further provided thereon. Where a metallic oxide layer is hard to adhere to the powdered metal, a metal layer may be provided on the substrate as a first step.

In using a metallic compound powder as a substrate, the process of the present invention typically includes first forming a metal layer on the substrate and then forming a metallic oxide layer thereon. The metal layer formation may further be followed by formation of a metallic oxide layer and then formation of a metallic oxide layer.

The metallic compound as a substrate typically includes a nitride of a metal or an alloy, a carbide of a metal or an alloy, and an oxide of a metal or an alloy. Examples of preferred metallic compounds are iron nitride, a nitride of an iron alloy, such as iron-nickel nitride or iron-cobalt nitride, and a metallic oxide, such as an oxide of iron, nickel, chromium, titanium, aluminum, silicon, calcium, magnesium or barium, and mixed compound oxides of these metals. These compounds may be magnetic or non-magnetic.

While not limiting, the particle size of the powder substrate is preferably from 0.01 μm to several millimeters, more preferably from 0.01 μm to 200 μm.

The metallic oxide which is to be formed on the surface of the substrate comprises a metal different from that constituting the substrate. Formation of a metallic oxide layer on powder of the same metallic oxide provides little technical benefit.

Examples of the metallic oxide include an oxide of iron, nickel, chromium, titanium, zinc, aluminum, cadmium, zirconium, silicon, calcium, magnesium or barium. The kind of the metallic oxide is selected appropriately according to the property to be imparted to the powder substrate.

Not only one but also a plurality of metal or metallic oxide layers may be provided. In either case, an individual layer has a thickness of from 0.01 μm to 20 μm, preferably from 0.02 μm to 5 μm. A plurality of metal or metallic oxide layers may be provided in such a manner that a layer of an oxide of a metal different from the metal of a powder substrate is first formed on the substrate and subsequently a metal or metallic oxide layer which may be either the same as or different from the first metal or metallic oxide layer is formed thereon. Where the substrate is a metallic oxide, it is recommended to form at least two metal or metallic oxide layers thereon.

A metal layer can be formed by dispersing a powder substrate in an aqueous solution of a complex salt of the metal and reducing the metal complex salt in the presence of the powder to form a layer of the metal on the surface of the powder.

Examples of the metal layer include a layer of silver, cobalt, gold, palladium, copper or platinum.

The above-mentioned metal complex salt is produced by adding a complexing agent to a water-soluble metal salt. For example, aqueous ammonia is added to silver nitrate, or an aqueous solution of sodium citrate or potassium tartrate is added to cobalt sulfate.

A metallic oxide layer can be formed by dispersing a powder substrate, i.e., metal powder, metallic compound powder or metal powder with a metal layer, in a solution of an alkoxide of a metal providing a desired metallic oxide, and hydrolyzing the metal alkoxide to form a corresponding metallic oxide on the powder substrate. The process utilizing hydrolysis of a metal alkoxide is called a sol-gel process, by which a fine oxide of uniform composition can be formed. Application of the sol-gel process to a powdered substrate provides a layer having a uniform and large thickness. A layer having a uniform thickness as used herein means a layer having a thickness of which fluctuation obtained from the observation of a cross section of the layer coated on the surface of the powder by SEM (Scanning Electron Microscope) is within 20%.

The metal alkoxide is selected according to the desired metallic oxide from among alkoxides of zinc, aluminum, cadmium, titanium, zirconium, tantalum, silicon, etc. In preparation of magnetic powder for magnetic toners, titanium oxide or silicon oxide is often used as a surface metallic oxide. In this case, a titanium alkoxide or a silicon alkoxide is chosen. Examples of the alkoxide include a monoalkoxide, such as methoxide, ethoxide, isopropoxide or butoxide, and a polymer of alkoxide, such as a polymer of isopropoxide or butoxide.

Since the metal alkoxide is decomposable with water, a metallic oxide should be used as a solution in an organic solvent. Suitable organic solvents include alcohols, e.g., ethanol and methanol, and ketones. It is preferable to use a dehydrated organic solvent. The concentration of the metal alkoxide is subject to variation depending on the kinds of the metal alkoxide and the organic solvent. The optimum concentration should be decided accordingly. The concentration of a metal alkoxide solution and the amount of the metal alkoxide solution based on the powder, determine the thickness of the metallic oxide layer to be formed on the powder. The concentration of the metal alkoxide solution depends on the amount and particle size of the powder. For example, when a methoxide, an ethoxide, or an isopropoxide is used as the metal alkoxide, the concentration of the solution thereof is preferably from 0.1% to 80% because the metal alkoxide is hydrolyzed at a high rate. When a butoxide, a polymer of isopropoxide or a polymer of butoxide is used as the metal alkoxide, the concentration of the solution thereof is preferably from 0.1% to 90% though the metal alkoxide is hydrolyzed at a low rate. If the concentration of the solution exceeds the above upper limit, it is not preferable because oxide powders comprising the metal alkoxide which is to coat the metal or metallic oxide powder are produced as impurities. If the concentration of the solution is less than 0.1%, it is not preferable because the layer formed cannot function as an electrical insulating layer or a reflective layer in a visible ray region.

The metal or metallic compound powder is dispersed in the metal alkoxide solution, and water is added thereto to hydrolyze the metal alkoxide to produce a corresponding metallic oxide and, at the same time, to precipitate it on the powder to form a layer of the metallic oxide. The powder with the metallic oxide layer is taken out of the solution and dried to obtain powder having the metallic oxide layer with firm adhesion.

In carrying out the metallic oxide layer formation, the powder is dispersed, e.g., in a dehydrated alcohol, and a metal alkoxide solution is added thereto while thoroughly stirring. To the resultant uniform mixture is slowly added a mixture of alcohol and water to cause hydrolysis of the metal alkoxide thereby precipitating a metallic oxide on the surface of the powder. In the mixture of alcohol and water, the concentration of water is preferably from 0% to 60% of the total solution. If the concentration thereof exceeds 60%, it is not preferable because coarse powders consisting of a metal alkoxide are produced as impurities just after the mixture thereof is added dropwise. The metallic oxide layer thus formed on the powder is then dried to give coated powder. Drying is preferably conducted in vacuo.

The metallic oxide layer thus formed on the powder is then dried to give powder with a single metallic oxide layer. In preparation of powder with a plurality of metallic oxide layers, the above-described reaction step for metallic oxide layer formation is repeated as many times as desired, finally followed by drying.

In the hydrolysis system, a sol of a metallic oxide is first produced, which then sets to gel. After a while from completion of the hydrolysis, gelation proceeds. In some cases, gelation completes on drying. During the reaction, the sol is formed on the surface of the powder to provide a continuous film. Accordingly, a strong metallic oxide layer having a uniform thickness and a uniform composition can be formed easily. A metallic oxide layer having such properties cannot be obtained by any conventional film formation method, such as depositing.

If the hydrolysis system contains a large proportion of water, the reaction proceeds at a high rate so that fine metallic oxide particles are apt to be formed. In order to make the reaction milder, an amine may be added to the system. Examples of the amine include trimethylamine and diethylamine. The added amount thereof is preferably from 0% to 15% of the amount of the total solution. If desired, a catalyst, such as an acid, may be used for reaction acceleration. Examples of the acid include hydrochloric acid, acetic acid, nitric acid, oxalic acid, formic acid, and tartaric acid. The added amount thereof is preferably from 0% to 10% of the amount of the total solution. If the amount exceeds 10%, it is not preferable because the oxide powders comprising the metal alkoxide are produced by the acceleration of the hydrolysis rate as impurities.

According to the process of the present invention, there is obtained a metallic oxide layer having excellent properties, unlike a metallic oxide layer simply resulting from surface oxidation of metal powder. The process is also useful in formation of a metallic oxide layer whose metal is the same as that constituting the powder substrate. Therefore, application of the process to preparation of metal or metallic compound powder having an oxide layer of the same metal as that of the powder is also included in the scope of the present invention.

The thus prepared metal or metallic compound powder having thereon a metallic oxide layer possesses various combined properties according to the material of the substrate and that of the surface metallic oxide, which may easily be selected to provide various useful properties for different purposes. For example, choice of magnetic powder, such as tri-iron tetroxide, as a substrate, silicon oxide having a lower refractive index than that of the substrate as a metallic oxide layer to be formed on the substrate, and metallic silver having a higher refractive index as a metal layer to be formed as an outer layer results in production of magnetic powder having a high degree of whiteness. When a metallic compound is used as a substrate, for example, silicon oxide having a lower refractive index than that of the substrate is coated as the first metallic oxide layer on the substrate; titanium oxide having a higher refractive index than that of the silicon oxide is coated as the second metallic oxide layer on the first layer; and metal having a lower refractive index is coated as an outer layer, since it is essential that the last layer has higher reflective index.

Further, choice of silver, copper or aluminum as a substrate; gold, platinum or silver as a metal layer to be formed on the substrate; and aluminum oxide as a metallic oxide layer to be formed thereon results in production of heat conductive powder with an electrically insulating surface layer.

When a transparent oxide dielectrics layer having a higher refractive index and a transparent oxide dielectrics layer having a lower refractive index are alternately laminated on the substrate (i.e., powder), and when the relationship among the layer thickness, the refractive index of dielectrics layer and the target wavelength satisfies the following equation (I), the oxide dielectrics reflective layer which reflects the vertical incident light of the target wavelength can be prepared:

$$nd=2m-1/4\lambda \qquad (I)$$

wherein n represents a refractive index; d represents a layer thickness; $\lambda$ represents a wavelength; and m represents an integer. nd, which represents the product of the refractive index and the actual layer thickness, is called as an optical layer thickness.

When light incidents on two layers of which refractive indexes are different, the light reflects on the boundary side thereof. When alternate layers each having a thickness corresponding to odd number times of a quarter of a wavelength, the light reflection becomes stronger and comes to be an interference reflection which produces a stationary wave having the wavelength. Accordingly, a white powder can be prepared by means that the powder has a plurality of layers each having an optical layer thickness corresponding to odd number times of a quarter of the wavelength, such as a quarter, three quarters, or five quarters of the wavelength.

More particularly, when a plurality of coating layers different in refractive index are each provided on the surface of an object to such a thickness that the product of the refractive index of the layer and the thickness of the layer corresponds to a quarter of the wavelength of electromagnetic waves, light is mostly reflected thereon by interference (Fresnel reflection). This phenomenon can be utilized to prepare magnetic powder for a magnetic toner which totally reflects light and shines in white. In greater detail, such a white magnetic powder can be prepared by selecting a powdered magnetic substance, such as metal (e.g., iron, cobalt or nickel), an alloy thereof or iron nitride, as a core material, forming thereon a metal layer having a high refractive index (e.g., silver or cobalt) to a thickness corresponding to a quarter wavelength of visible light, forming thereon a metallic oxide layer having a lower refractive index than that of a metal (e.g., silicon oxide or titanium oxide) to a thickness corresponding to a quarter wavelength of visible light, and further forming thereon a metal layer having a high refractive index (e.g., silver or cobalt) to a thickness corresponding to a quarter wavelength of visible light.

If a colored layer is provided on the resulting white magnetic powder, followed by formation of a resin layer thereon, a color magnetic toner can be produced. Because the wavelength of visible light has a range, the metal layers and metallic oxide layers alternating with each other may have somewhat different thicknesses within the range of a quarter of the visible light wavelength.

FIG. 1 illustrates a cross section of a particle having the above-mentioned structure, in which magnetic powder 1 as a core is provided with a plurality of metallic oxide layers A and a plurality of metallic oxide layers B.

Figure 2:
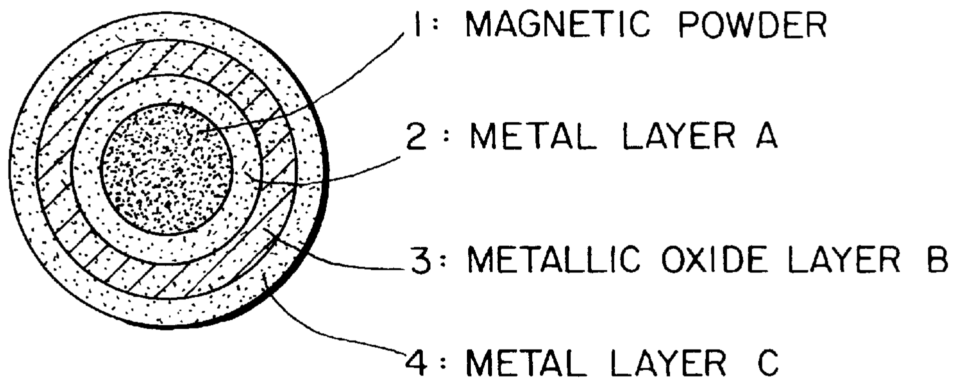

FIG. 2 illustrates a cross section of a particle having the above-mentioned structure, in which magnetic powder 1 as a core is provided with a plurality of layers consisting of metal layer A, metallic oxide layer B, and outermost metal layer C.

Use of the aforesaid magnetic toner is well-known in the art in a conventional method such as now described, and is described in, for example, U.S. Pat. No. 3,909,258.

A photoreceptor is prepared by coating a conductive substrate, such as a polyester film having thereon a metal deposited layer, with a coating composition comprising a binder resin, such as an acrylic resin, being dispersed therein fine particles of a photoconductive semiconductor, such as zinc oxide, a sensitizing dye, a color sensitizer, a dispersant, etc. to form a photoconductive layer.

The photoreceptor is uniformly charged by corona discharge and exposed to light having reflected on an original copy to be copied whereupon a positive electrostatic latent image is formed on the photoreceptor. The latent image is transferred to a transfer material, such as paper, and a magnetic toner charged to polarity opposite to the positive latent image is adhered to the latent image by means of a magnetic brush comprising the magnetic toner. Removal of non-adhered toner particles from the transfer material gives a magnetic toner image corresponding to the original copy. The toner image is then fixed to obtain a copy. With white paper and a colored magnetic toner prepared by coloring the coated powder of the present invention, the resulting copy would be an image of outstanding quality. A colored magnetic toner can be prepared by means that a white magnetic toner is dyed with color organic dyes or pigments.

The present invention will now be illustrated in greater detail with reference to Examples, but the present invention is not to be construed as being limited thereto. Unless otherwise indicated, all parts, percents and ratios are by weight.

EXAMPLES

Example 1

Dehydrated Ethanol:

General dehydrated ethanol was further dehydrated with Molecular Sieve 3A1/8 at least overnight, filtered in a gloved box purged with argon gas, and preserved in a glass bottle with a stopper. In what follows, "dehydrated ethanol" means the thus prepared one.

Slurry 1:

A hundred grams of iron carbonyl powder (produced by BASF; average particle size: 1.8 $\mu$m) were put in a glass container equipped with a high-speed stirrer, and 300 ml of dehydrated ethanol was added thereto, followed by thoroughly stirring by means of the high-speed stirrer to prepare slurry 1.

Solution 1:

In a gloved box purged with argon gas, 300 ml of dehydrated ethanol and 33 g of tetraethyl orthosilicate were measured or weighed and mixed in a glass bottle with a stopper to prepare solution 1. The glass bottle was sealed.

Slurry 2:

The container containing solution 1 was taken out of the gloved box, and the content was poured into the container containing slurry 1 all at once. The mixture was thoroughly stirred at a high speed to prepare slurry 2.

Solution 2:

To 200 ml of dehydrated ethanol was added 2.7 g of pure water to prepare solution 2.

Solution 2 was added dropwise to slurry 2 by means of a buret over 1 hour while stirring slurry 2 sufficiently that the powder therein did not sediment, to thereby conduct hydrolysis slowly. After the dropwise addition, the resulting slurry (slurry 3) was stirred for about 8 hours, followed by centrifugation. The supernatant liquor was discarded to collect solid matter 1. Solid matter 1 was dried in vacuo to obtain sample 1, which was silicon oxide-coated iron powder.

Sample 1 was found to have a silicon oxide ($SiO_2$) content of 6.3%, from which the thickness of the silicon oxide layer was found to be 0.18 $\mu$m.

The resulting silicon oxide-coated iron powder was poured into 300 ml of dehydrated ethanol, followed by thoroughly stirring to prepare a dispersion. To the dispersion was added a previously prepared mixed solution of 42 g of tetraethyl orthotitanate and 300 ml of dehydrated ethanol, and the stirring was continued to prepare slurry 4.

To slurry 4 while being stirred was added dropwise a previously prepared mixed solution of 3.3 g of pure water and 200 ml of dehydrated ethanol over 1 hour. After the addition, the stirring was continued for an additional period of 8 hours, followed by centrifugal separation. The precipitate thus collected was dried to obtain sample 2. Sample 2 had a titanium oxide ($TiO_2$) content of 11.1%, from which the thickness of the titanium oxide layer was found to be 0.16 $\mu$m.

Example 2

A hundred grams of iron nitride powder (produced by NITTETSU MINING CO., LTD.; average particle diameter: 0.8 $\mu$m) were thoroughly stirred in 300 ml of dehydrated ethanol in a high-speed stirring machine in the same manner as in Example 1 to prepare slurry 5. To slurry 5 was added a solution of 105 g of tetraethyl orthosilicate in 300 ml of dehydrated ethanol, followed by mixing with stirring, and a solution of 8.6 g of pure water and 300 ml of dehydrated ethanol was further added thereto dropwise over 1 hour.

After the addition, the stirring was continued for 10 hours, and the mixture was allowed to stand and separated into a solid and a liquid. The solid was dried in vacuo to obtain sample 3. Sample 3 contained 24.4% of silicon oxide, indicating that the thickness of the silicon oxide layer was 0.11 $\mu$m.

Sample 3 was dispersed in 300 ml of dehydrated ethanol to prepare slurry 6. To slurry 6 was dispersed a mixed solution of 300 ml of dehydrated ethanol and 163 g of tetraethyl orthotitanate, and a solution of 300 ml of dehydrated ethanol and 12.8 g of pure water was added thereto dropwise over 1 hour. After the addition, the mixture was stirred for 10 hours, allowed to stand, and separated into a solid and a liquid. The solid was dried in vacuo to obtain sample 4. Sample 4 contained 31.3% of titanium oxide, indicating that the thickness of the titanium oxide layer was 0.10 $\mu$m.

Example 3

In 300 ml of dehydrated ethanol was thoroughly stirred 600 g of atomized copper powder (average particle diameter: 6.0 $\mu$m) in a high-speed stirring machine in the same manner as in Example 1 to prepare slurry 7. To slurry 7 was added a solution of 83 g of tetraethyl orthotitanate in 300 ml of dehydrated ethanol all at once, followed by thoroughly stirring at a high speed, A solution consisting of 6.5 g of pure water and 200 ml of dehydrated ethanol was further added thereto dropwise over 1 hour. After the addition, the stirring was continued for 8 hours, and the mixture was allowed to stand and separated into a solid and a liquid. The solid was dried in vacuo to obtain sample 5. Sample 5 had an average particle diameter of 6.4 $\mu$m and a titanium oxide content of 2.2%, from which the thickness of the titanium oxide layer was estimated at 0.3 $\mu$m.

Example 4

Formation of Metal Layer:

A silver complex salt aqueous solution (hereinafter referred to as a silver liquid) and a solution of reducing agent (hereinafter referred to as a reducing liquid) were prepared as follows.

| Silver Liquid Composition: | |
|---|---|
| Silver nitrate | 3.75 g |
| Aqueous ammonia (sufficient amount for re-dissolving a precipitate formed) | |
| Water | 65 ml |
| Sodium hydroxide | 2.7 g/65 ml |

In 30 ml of water was dissolved 3.75 g of silver nitrate. To the solution was added aqueous ammonia having a specific gravity of 0.88 whereupon black brown silver oxide was precipitated. Addition of more aqueous ammonia resulted in formation of a silver-ammonia complex, which was dissolved to form a silver liquid.

| Reducing Liquid: | |
|---|---|
| Glucose | 4.5 g |
| Tartaric acid | 4 g |
| Dehydrated ethanol | 100 ml |
| Water | 1000 ml |

Glucose and tartaric acid were successively dissolved in 1000 ml of water, and the solution was boiled for 10 minutes. After cooling to room temperature, dehydrated ethanol was added thereto to prepare a reducing liquid. Since the reducing power of the reducing liquid is highest after about 1 week from the preparation, it is recommended to prepare the reducing liquid beforehand.

To 130 ml of the silver liquid was added 75 g of iron carbonyl powder, followed by thoroughly stirring. To the resulting dispersion was added 130 ml of the reducing liquid, and the mixture was stirred.

The resulting metal-coated powder A was washed with distilled water, filtered, and dried at room temperature in vacuo for 8 hours. Metal-coated powder A had a total silver content of 2.3 g, from which the thickness of the formed metal layer was estimated at 0.015 $\mu$m.

Formation of Metallic oxide Layer:

In 300 ml of dehydrated ethanol was dissolved 72 g of titanium ethoxide, and 75 g of metal-coated powder A was added thereto, followed by thoroughly stirring.

To the solution while being stirred was slowly added dropwise a previously prepared water-containing alcohol solution consisting of 36 g of distilled water and 300 g of ethanol. After the addition, the stirring was continued for an additional period of 5 hours, followed by filtration. The solid thus collected was dried at room temperature for 8 hours in a vacuum drier to obtain coated powder B. Coated powder B had a total titanium oxide ($TiO_2$) content of 25 g, from which the thickness of the titanium oxide layer was found to be 0.5 $\mu$m.

Formation of Metal Layer:

A silver liquid and a reducing liquid were prepared in the same manner as described above, except that the silver liquid had the following composition.

| | |
|---|---|
| Silver nitrate | 4.75 g |
| Aqueous ammonia (sufficient amount for re-dissolving a precipitate formed) | |
| Water | 83 ml |
| Sodium hydroxide | 3.41 g/83 ml |

To 166 ml of the silver liquid was added 75 g of coated powder B, followed by thoroughly stirring. To the resulting dispersion was added 166 ml of the reducing liquid, followed by stirring. In 5 minutes' stirring, silver began to precipitate and the precipitation completed in about 15 minutes. The thus obtained metal-coated powder C was washed with distilled water, filtered, and dried at room temperature in vacuo for 8 hours. Metal-coated powder C had a total silver content of 5.2 g, and subtraction of the formerly coated silver content gave 2.9 g, the silver content of the outermost metal layer, from which the thickness of the outermost layer was estimated at 0.015 $\mu$m.

Metal-coated powder C had a reflectance of 78% as measured with a whiteness meter. For comparison, the starting iron carbonyl powder had a reflectance of A3, revealing a great increase in reflectance by formation of coating layers.

Comparative Example 1

Comparative Example 1 describes a powder where the thickness of the outermost layer is decreased.

Seventy-five grams of coated powder B prepared in the same manner as in Example 4 was dispersed in a previously prepared mixed solution of 30 ml of the same silver liquid as used in the treatment of coated powder B in Example 4 and 136 ml of water. To the dispersion was added 166 ml of the same reducing liquid as used in Example 4, and the mixture was allowed to stand for 1 hour for completion of silver precipitation.

The resulting coated powder had a total silver content of 2.8 g, indicating that the silver content of the outermost metal layer was 0.5 g, from which the thickness of the outermost layer was estimated at 0.003 μm.

The metal-coated powder assumed no white color as expected but a dark bluish gray color. This is considered to be because the outermost silver layer was so thin that light was absorbed and not reflected.

In addition, since the metal layers and metallic oxide layers according to the present invention have a uniform thickness and firm adhesion to the powder substrate, they constitute a useful multi-layered surface layer which does not separate the substrate.

Specific examples of the use of the powder according to the present invention include white magnetic powder for magnetic toners and heat conductive powder having electrical insulating properties. The latter is useful as a filler for sealing compounds for semiconductors or a heat dissipating sheet for insulation and heat dissipation of electronic parts.

While the invention has been described in detail and with reference to specific embodiments thereof, it will be apparent to one skilled in the art that various changes and modifications can be made therein without departing from the spirit and scope thereof.

What is claimed is:

1. A process for preparing powder comprising a metal or metallic compound core having thereon a metallic oxide layer, which comprises the steps of:

(1) dispersing a metal or metallic compound powder in a solution of a metal alkoxide in an organic solvent to form a slurry;

(2) adding a mixture of water and an organic solvent to the slurry; and (3) hydrolyzing the metal alkoxide to form a metallic oxide layer having a uniform thickness of from 0.01 μm to 20 μm on the surface of the metal or metallic compound powder.

2. The process as claimed in claim 1, wherein the metal or metallic compound powder dispersed in the solution of the metal alkoxide comprises a magnetic metal.

3. A process for preparing powder comprising a metal or metallic compound core having thereon a metallic oxide layer and a metal layer, which comprises the steps of:

(1) dispersing a metal or metallic compound powder in a solution of a metal alkoxide in an organic solvent to form a slurry;

(2) adding a mixture of water and an organic solvent to the slurry;

(3) hydrolyzing the metal alkoxide to form a metallic oxide layer having a uniform thickness of from 0.01 μm to 20 μm on the surface of the metal or metallic compound powder; and (4) forming a metal layer having a uniform thickness of from 0.01 μm to 20 μm on the surface of the metallic oxide layer.

4. The process as claimed in claim 3, wherein the metal or metallic compound powder dispersed in the solution of the metal alkoxide comprises a magnetic metal.

5. The process as claimed in claim 3, wherein the metal or metallic compound powder dispersed in the solution of the metal alkoxide has a metal surface layer.

* * * * *